United States Patent
Kim et al.

(10) Patent No.: US 9,165,662 B2
(45) Date of Patent: Oct. 20, 2015

(54) SEMICONDUCTOR MEMORY DEVICE AND PROGRAMMING METHOD THEREOF

(71) Applicant: SK hynix Inc., Icheon-si Gyeonggi-do (KR)

(72) Inventors: Nam Hoon Kim, Icheon-si (KR); Min Kyu Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 14 days.

(21) Appl. No.: 14/162,874

(22) Filed: Jan. 24, 2014

(65) Prior Publication Data
US 2015/0070987 A1 Mar. 12, 2015

(30) Foreign Application Priority Data
Sep. 10, 2013 (KR) .................. 10-2013-0108572

(51) Int. Cl.
*G11C 16/06* (2006.01)
*G11C 16/12* (2006.01)
*G11C 16/34* (2006.01)

(52) U.S. Cl.
CPC ............ *G11C 16/12* (2013.01); *G11C 16/3459* (2013.01)

(58) Field of Classification Search
CPC ................................. G11C 16/02; G11C 16/06
USPC ........................................ 365/185.03, 185.22
See application file for complete search history.

(56) References Cited

U.S. PATENT DOCUMENTS 7,764,542 B2 * 7/2010 Edahiro et al. ........... 365/185.03
2009/0296466 A1 * 12/2009 Kim et al. ................ 365/185.03

FOREIGN PATENT DOCUMENTS

KR 1020130012308 A 2/2013

* cited by examiner

*Primary Examiner* — Amir Zarabian
*Assistant Examiner* — Muna A Techane
(74) *Attorney, Agent, or Firm* — William Park & Associates Ltd.

(57) ABSTRACT

A programming method of a semiconductor memory device includes, in an n-th program loop, applying a first program pulse to a first memory cell group, applying a second program pulse to a second memory cell group, and determining first fast cells and first slow cells in the first memory cell group, and in an n+1-th program loop, applying a third program pulse, which is increased by a step voltage from the first program pulse, to the first fast cells in the first memory cell group, and applying a fourth program pulse, which is increased by the step voltage from the second program pulse, to the first slow cells in the first memory cell group and the second memory cell group.

18 Claims, 10 Drawing Sheets

SEMICONDUCTOR MEMORY DEVICE AND PROGRAMMING METHOD THEREOF

CROSS-REFERENCE TO RELATED APPLICATION

The present application claims priority to Korean patent application number 10-2013-0108572 filed on Sep. 10, 2013, in the Korean Intellectual Property Office, the entire disclosure of which is incorporated by reference herein.

BACKGROUND

1. Technical Field

Various embodiments relate generally to a semiconductor memory device and a programming method thereof.

2. Related Art

A semiconductor memory device is a storage device that is realized using a semiconductor made from, for example, silicon (Si), germanium (Ge), gallium arsenide (GaAs), or indium phosphide (InP). Semiconductor memory devices can be classified as volatile memory devices or nonvolatile memory devices.

A volatile memory device is unable to retain its stored data when the power is turned off. The volatile memory device includes a static random access memory (SRAM) device, a dynamic RAM (DRAM) device, a synchronous DRAM (SDRAM) device, or the like. A non-volatile memory device can retain its stored data even when powered off. The non-volatile memory device may include a read only memory (ROM) device, a programmable ROM (PROM) device, an electrically programmable ROM (EPROM) device, an electrically erasable and programmable ROM (EEPROM) device, a flash memory device, a phase-change RAM (PRAM) device, a magnetic RAM (MRAM) device, a resistive RAM (RRAM) device, a ferroelectric RAM (FRAM) device, or the like. A flash memory device may be classified as a NOR type or a NAND type.

The degree of integration of a semiconductor memory device has gradually increased over time. However, with the increased degree of integration of the semiconductor memory device, problems have arisen in the operations of the semiconductor memory device, such as coupling between neighboring cells, a wider threshold voltage distribution width resulting from a program disturb, or increased programming time to reduce the threshold voltage distribution width.

BRIEF SUMMARY

Various embodiments relate to a semiconductor memory device having a narrow threshold voltage distribution and reducing programming time.

A programming method of a semiconductor memory device according to an embodiment of the present invention includes, in an n-th program loop, applying a first program pulse to a first memory cell group, applying a second program pulse to a second memory cell group, and determining first fast cells and first slow cells in the first memory cell group, and in an n+1-th program loop, applying a third program pulse, which is increased by a step voltage from the first program pulse, to the first fast cells in the first memory cell group, and applying a fourth program pulse, which is increased by the step voltage from the second program pulse, to the first slow cells in the first memory cell group and the second memory cell group.

A semiconductor memory device according to an embodiment of the present invention includes a memory cell array including a plurality of memory cells coupled to a plurality of word lines, and a peripheral circuit suitable for, during a program operation, applying a first program pulse to first word lines coupled to a first memory cell group, applying a second program pulse to second word lines coupled to a second memory cell group and determining first fast cells and first slow cells in the first memory cell group in an n-th program loop, the peripheral circuit suitable for applying a third program pulse, which is increased by a step voltage from the first program pulse, to word lines coupled to the first fast cells, among the first word lines, and applying a fourth program pulse, which is increased by the step voltage from the second program pulse, to word lines coupled to the first slow cells, among the first word lines, and the second word lines in an n+1-th program loop.

A programming method of a semiconductor memory device according to an embodiment of the present invention includes, in an n-th program loop, applying a first program pulse to memory cells, and determining fast cells and slow cells, among the memory cells, and in an n+1-th program loop, applying a verify voltage as a bias voltage to a bit line coupled to the fast cells, and applying a second program pulse, which is increased by a sum of the step voltage and the verify voltage from the first program pulse, to the memory cells.

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
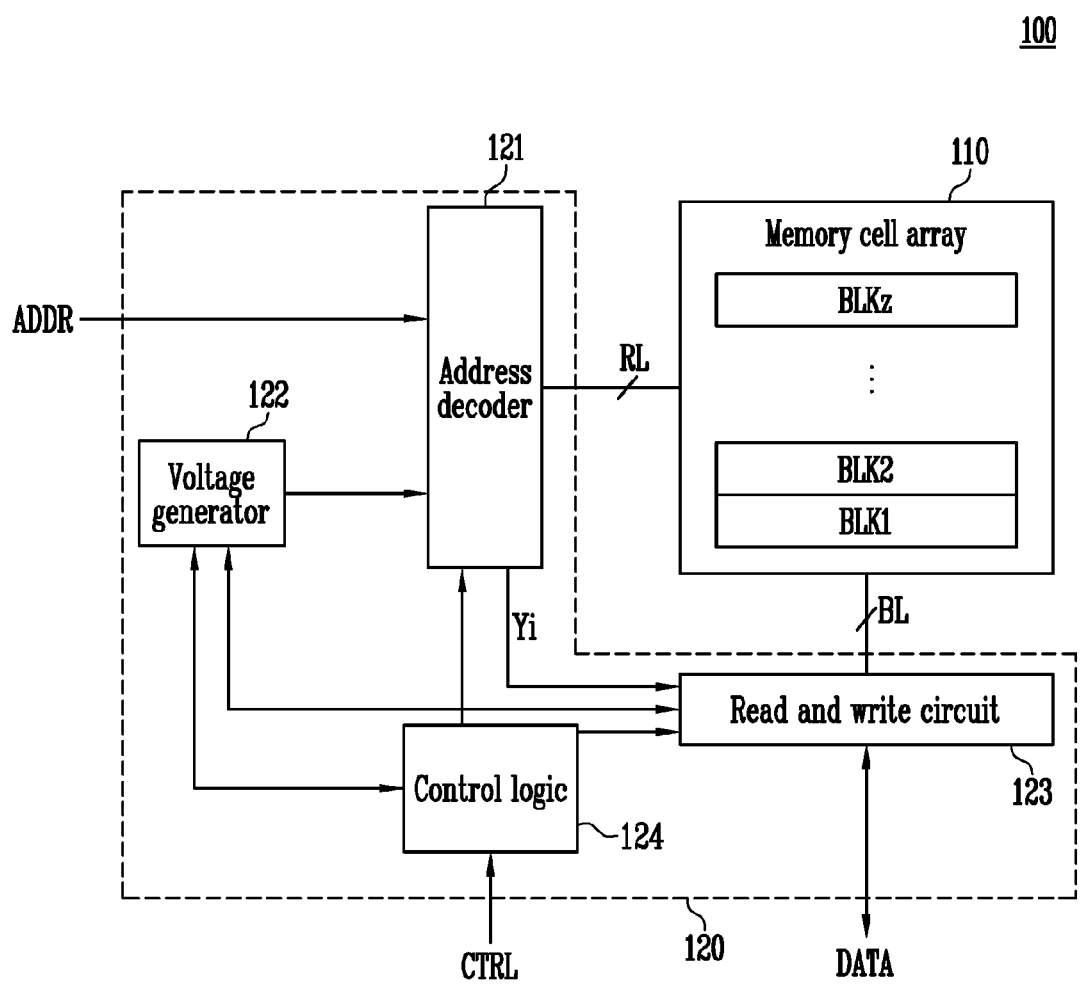
FIG. 1 is a block diagram illustrating a memory device according to an embodiment of the present invention.

FIG. 1 is a block diagram illustrating a semiconductor memory device 100 according to an embodiment of the present invention.

Referring to FIG. 1, the semiconductor memory device 100 may include a memory cell array 110 and a peripheral circuit 120 that drives the memory cell array 110.

The memory cell array 110 may include memory blocks BLK1 to BLKz. The memory blocks BLK1 to BLKz may be coupled to an address decoder 121 through row lines RL. The memory blocks BLK1 to BLKz may be coupled to a read and write circuit 123 through bit lines BL. Each of the memory blocks BLK1 to BLKz may include a plurality of cell strings. Each of the cell strings may include a plurality of memory cells. According to an embodiment, the plurality of memory cells may be non-volatile memory cells. According to an embodiment, each of the plurality of memory cells may be defined as a single level cell or a multi-level cell.

The peripheral circuit 120 may be configured to drive the memory cell array 110. The peripheral circuit 120 may include the address decoder 121, a voltage generator 122, the read and write circuit 123 and a control logic 124.

The address decoder 121 may be coupled to the memory cell array 110 through the row lines RL. The row lines RL may include drain selection lines, word lines, source selection lines and a common source line. The address decoder 121 may be configured to drive the row lines RL in response to control of the control logic 124. The address decoder 121 may receive addresses ADDR from exterior or from an input/output buffer (not illustrated) in the semiconductor memory device 100.

The address decoder 121 may be configured to decode a block address, among the received addresses ADDR. The address decoder 121 may select at least one of the memory blocks in response to the decoded block address.

The address decoder 121 may be configured to decode a row address, among the received addresses ADDR. The address decoder 121 may be configured to apply voltages, provided from the voltage generator 122, to the row lines RL in response to the decoded row address.

The address decoder 121 may be configured to decode a column address, among the received addresses ADDR. The address decoder 121 may transfer the decoded column address Yi to the read and write circuit 123.

A program operation of the semiconductor memory device 100 may be performed by page units. At the request of a program, the addresses ADDR may include a block address, a row address and a column address. The address decoder 121 may select one memory block, one drain selection line and one word line in response to the addresses ADDR. The address decoder 121 may provide the decoded column address Yi to the read and write circuit 123.

The address decoder 121 may include a block decoder, a row decoder, a column decoder and an address buffer.

The voltage generator 122 may be configured to generate a plurality of voltages by using an external voltage that is applied to the semiconductor memory device 100. The voltage generator 122 may operate in response to control of the control logic 124. The voltages, generated by the voltage generator 122, may be used as driving voltages of the address decoder 121, the read and write circuit 123 and the control logic 124. According to an embodiment, the voltage generator 122 may include a circuit suitable for generating a power voltage by regulating an external voltage. According to an embodiment, the voltage generator 122 may include a plurality of pumping capacitors and generate a plurality of voltages by selectively activating the plurality of pumping capacitors. In addition, the voltage generator 122 may be configured to generate a program pulse and a plurality of verify voltages.

The read and write circuit 123 may be coupled to the memory cell array 110 through the bit lines BL. The read and write circuit 123 may operate in response to control of the control logic 124.

During a program operation, the read and write circuit 123 may exchange data DATA with exterior or an input/output buffer (not illustrated) of the semiconductor memory device 100. During the program operation, the read and write circuit 123 may receive or store the data DATA to be programmed and transfer the stored data DATA to the bit lines BL indicated by the decoded column address Yi, among the bit lines BL. In accordance with the transferred data, threshold voltages of memory cells coupled to a selected word line (hereinafter, "memory cells") may increase, and the selected memory cells may be programmed. During a verify operation, the read and write circuit 123 may read the threshold voltages of the selected memory cells through the bit lines BL indicated by the decoded column address Yi, among the bit lines BL, and determine whether the threshold voltages of the selected memory cells have reached a desired level. Depending on a result of the determination, the program operation may be performed again.

According to an embodiment, the read and write circuit 123 may include page buffers (or page registers), a column selection circuit and the like.

The control logic 124 may be coupled to the address decoder 121, the voltage generator 122 and the read and write circuit 123. The control logic 124 may receive a control signal CTRL from exterior or the input/output buffer (not illustrated) of the semiconductor memory device 100. The control logic 124 may be configured to control the general operation of the semiconductor memory device 100 in response to the control signal CTRL.

The semiconductor memory device 100 may further include the input/output buffer (not illustrated). The input/output buffer may receive the control signal CTRL and the addresses ADDR from exterior and transfer the control signal CTRL and the addresses ADDR to the control logic 124 and the address decoder 121. In addition, the input/output buffer may be suitable for transferring the externally input data DATA to the read and write circuit 123 and transfer the data DATA from the read and write circuit 123 to the exterior.

During a program operation, a peripheral circuit according to an embodiment of the present invention may apply a first program pulse to first word lines coupled to a first memory cell group, apply a second program pulse to second word lines coupled to a second memory cell group, and determine first fast cells and first slow cells in the first memory cell group in an n-th program loop (where n represents a positive integer). During the program operation, the peripheral circuit may apply a third program pulse, which is increased by a step voltage from the first program pulse, to word lines coupled to the first fast cells, among the first word lines, and apply a fourth program pulse, which is increased by the step voltage from the second program pulse, to the word lines coupled to the first slow cells, among the first word lines, and the second word lines in an n+1-th program loop (where n represents a positive integer).

The first memory cell group and the second memory cell group may be programmed to different target levels (i.e., target voltage levels) from each other. The second memory cell group may be programmed to a higher target level than the first memory cell group. The second memory cell group may include cells programmed to different target levels.

In addition, when determining the first fast cells and the first slow cells in the first memory cell group, the peripheral circuit according to an embodiment of the present invention may apply a verify voltage to the first word lines and determine cells having threshold voltages less than the verify voltage as the first slow cells and cells having threshold voltages higher than the verify voltage as the first fast cells. The verify voltage may be a difference value between a program start voltage of the second memory cell group and a program start voltage of the first memory cell group.

In addition, when determining the first fast cells and the first slow cells in the first memory cell group, the peripheral circuit according to an embodiment of the present invention may determine whether at least one of the memory cells in the first memory cell group has reached the target level of the corresponding cell and may determine the first fast cells and the first slow cells when at least one of the cells in the first memory cell group has reached the target level of the corresponding cell.

In addition, the peripheral circuit according to an embodiment of the present invention may apply a fifth program pulse to third word lines coupled a third memory cell group, determine second fast cells and second slow cells in the second memory cell group in the n-th program loop. In addition, the peripheral circuit may apply a sixth program pulse, which is increased by the step voltage from the fifth program pulse, to word lines coupled to the second slow cells, among the second word lines, and the third word lines, and apply a fourth program pulse to the word lines coupled to the first slow cells, among the first word lines, and word lines coupled to the second fast cells, among the second word lines, in the n+1-th program loop.

The peripheral circuit according to an embodiment of the present invention may use an ISPP method in order to increase a program speed. According to the ISPP method, a selected page may be programmed several times as a word line bias voltage is gradually increased at each step (i.e., each program cycle).

During a program operation, a peripheral circuit according to an embodiment of the present invention may be configured to apply a first program pulse to a plurality of word lines coupled to memory cells and determine fast cells and slow cells, among memory cells, in an n-th program loop. The peripheral circuit may apply a verify voltage as a bias voltage to a bit line coupled to the fast cells and apply the second program pulse, which is increased by the sum of the step voltage and the verify voltage from the first program pulse, to the memory cells in the n+1-th program loop. In addition, when determining the fast cells and the slow cells, among the memory cells, the peripheral circuit may apply the verify voltage and determine cells having threshold voltages less than the verify voltage as the slow cells and cells having threshold voltages higher than the verify voltage as the fast cells. The verify voltage may be a difference value between an n target level to which some of the memory cells are programmed and an n+1 target level to the rest of the memory cells or some of the memory cells are programmed.

In addition, when determining the fast cells and the slow cells among the memory cells, the peripheral circuit according to an embodiment of the present invention may determine whether at least one of the memory cells has reached a target level of the corresponding cell and may determine the fast cells and the slow cells when the at least one of the memory cells has reached the target level of the corresponding cell.

These operations of the peripheral circuit 120 may be performed using the address decoder 121, the voltage generator 122, the read and write circuit 123 and the control logic 124 that are included in the peripheral circuit 120.

The above-described operations of the semiconductor memory device will be described below in detail.

Figure 2:
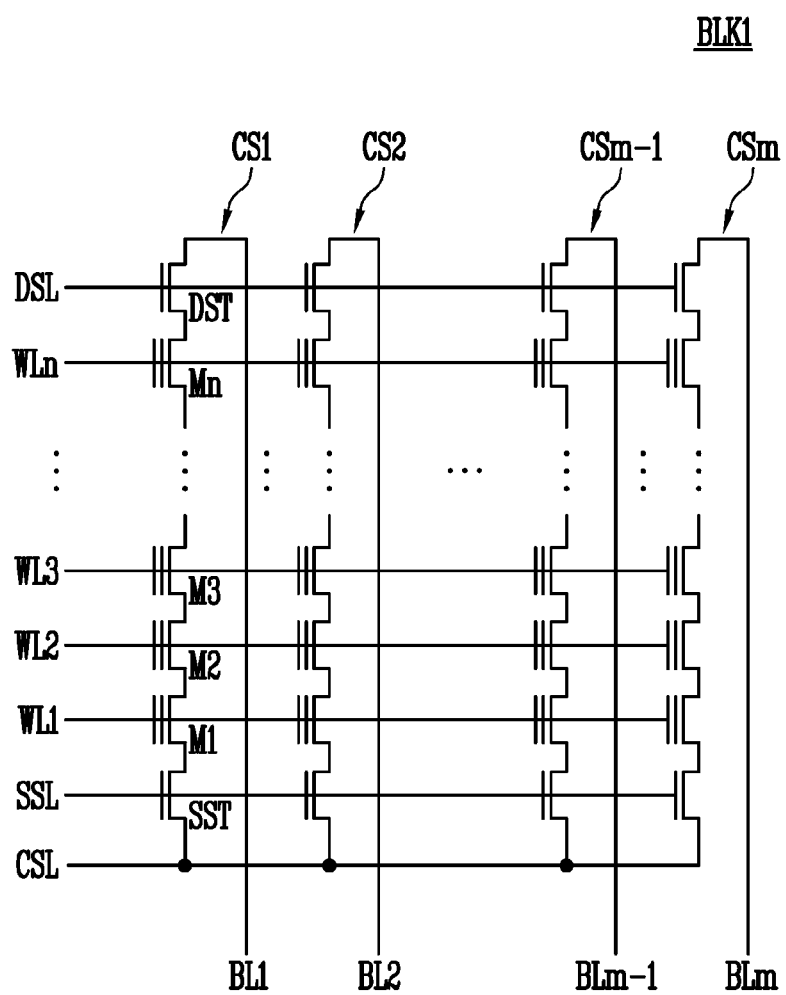
FIG. 2 is a block diagram illustrating any one of a plurality of memory blocks shown in FIG. 1.

FIG. 2 is a block diagram illustrating any one of the memory blocks BLK1 to BLKz, i.e., the memory block BLK1 (where z is an integer greater than 1).

Referring to FIG. 2, the memory block BLK1 may include cell strings CS1 to CSm (where m is an integer greater than 1). The cell strings CS1 to CSm may be coupled to first to m-th bit lines BL1 to BLm (BL in FIG. 1) (where m is an integer greater than 1), respectively.

Each of the cell strings CS1 to CSm may include a source selection transistor SST, memory cells M1 to Mn (where n is an integer greater than 1) coupled in series with each other and a drain selection transistor DST. The source selection transistor SST may be coupled to the source selection line SSL. The first to n-th memory cells M1 to Mn may be coupled to first to n-th word lines WL1 to WLn (where n is an integer greater than 1), respectively. The drain selection transistor DST may be coupled to a drain selection line DSL. The common source line CSL may be coupled to a source side of the source selection transistor SST. Each of the bit lines BL1 to BLm may be coupled to a drain side of the drain selection transistor DST. The source selection line SSL, the first to n-th word lines WL1 to WLn and the drain selection line DSL may be included in the row lines RL described above with reference to FIG. 1. The source selection line SSL, the first to n-th word lines WL1 to WLn and the drain selection line DSL may be driven by the address decoder 120.

The memory block BLK1, illustrated in FIG. 2, is merely an example of an embodiment of the present invention. It is obvious to a person of ordinary skill in the art that various modifications can be devised depending on a memory cell array structure that will fall within the sprit and scope of the principles of this disclosure.

Figure 3:
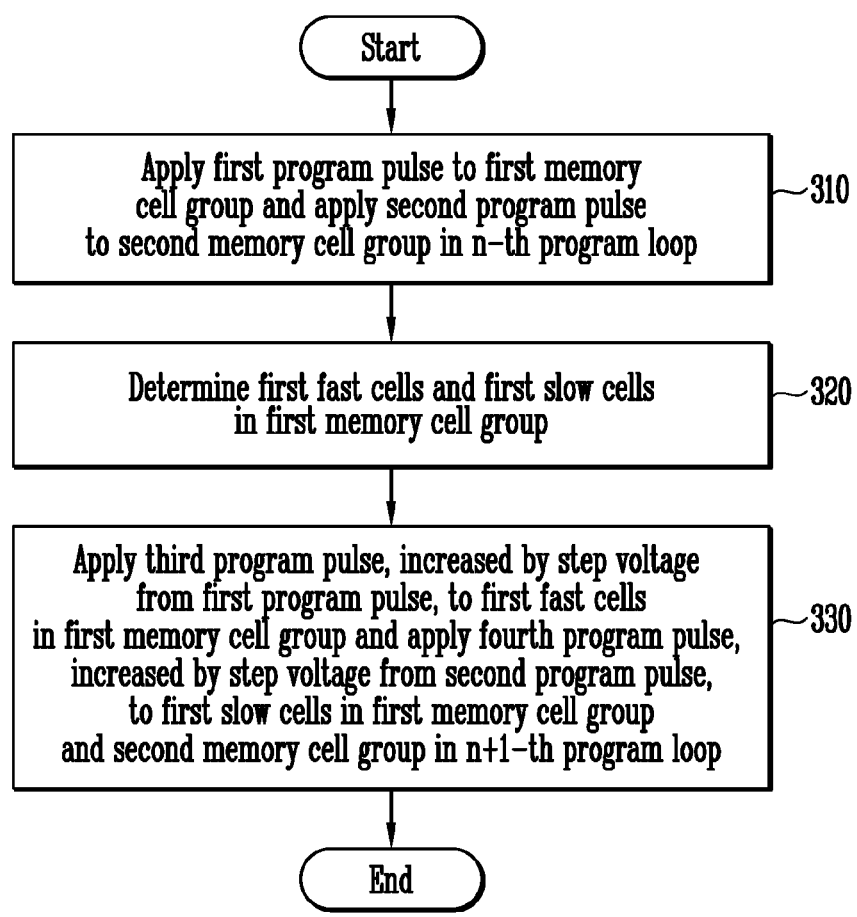
FIG. 3 is a flowchart illustrating a programming method of a semiconductor memory device according to an embodiment of the present invention.

FIG. 3 is a flowchart illustrating a programming method of a semiconductor memory device according to an embodiment of the present invention.

Figure 4:
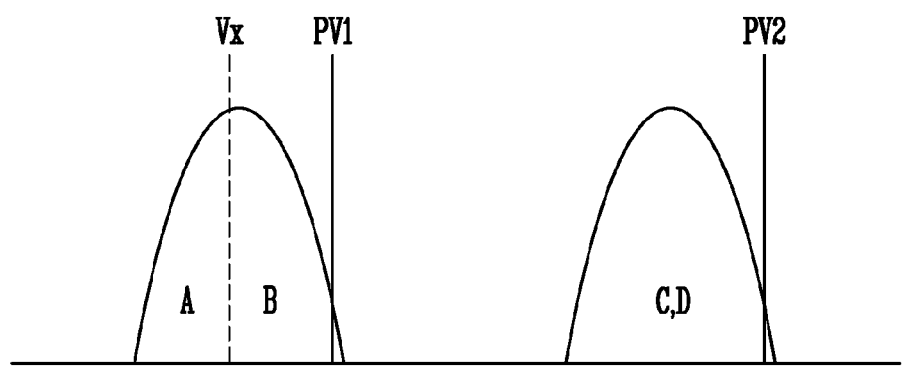
FIG. 4 is a diagram illustrating a threshold voltage distribution of memory cells programmed by a programming method of a semiconductor memory device according to an embodiment of the present invention.
Figure 5:
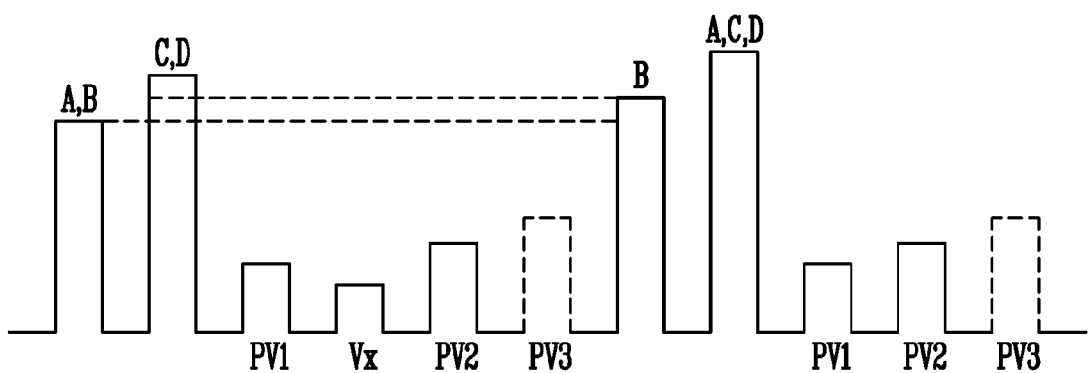
FIG. 5 is a diagram showing how a program voltage and a verify voltage are applied for illustrating a programming method of a semiconductor memory device according to an embodiment of the present invention.

In addition, FIG. 4 is a diagram illustrating a threshold voltage distribution of memory cells programmed by a programming method of a semiconductor memory device according to an embodiment of the present invention. FIG. 5 is a diagram showing how a program voltage and a verify voltage are applied for illustrating a programming method of a semiconductor memory device according to an embodiment of the present invention.

A programming method of a semiconductor memory device according to an embodiment of the present invention is described below. First, the peripheral circuit 120 may apply the first program pulse to the first memory cell group in the n-th program loop (where n is a positive integer) and apply the second program pulse to the second memory cell group at step S310. This program pulse may be generated by the voltage generator 122. The first memory cell group and the second memory cell group may be cell groups that are programmed to different target levels (i.e., target voltage levels). In addition, the second memory cell group may be programmed to a higher target level than the first memory cell group. In addition, the second memory cell group may include cells that are programmed to different target levels.

In FIGS. 4 and 5, memory cells A and B may correspond to a single memory cell group, and memory cells C and D may correspond to another memory cell group. The memory cells A and B may be included in a cell group programmed to reach PV1 as the target level (i.e., target voltage level). The memory cells C and D may be included in a cell group programmed to reach PV2 as the target level. Referring to FIG. 5, program pulses having different levels (i.e., voltage levels) may be applied to the memory cells A and B and the memory cells C and D in a pervious program loop.

However, the memory cells C and D corresponding to the single memory cell group may be programmed to different target levels. In other words, referring to FIG. 4, the memory cell C may be programmed to reach PV2 as the target level, and the memory cell D may be programmed to reach PV3 (not illustrated) as the target level. Such characteristics may indicate that the programming method of the semiconductor memory device according to an embodiment of the present invention may be applied to both multi-level cells (MLC) and triple level cells (TLC). However, the present invention is not limited thereto, and this programming method may be applied to cells having other various levels. Referring to FIG. 5, when the memory cells C and D are programmed to different target levels, a verify voltage Vx indicated by a dotted line may be applied thereto.

The peripheral circuit 120 may determine first fast cells and first slow cells in the first memory cell group at step S320. The peripheral circuit 120 may apply the verify voltage Vx to the first memory cell group and determine cells having threshold voltages less than the verify voltage Vx as the first slow cells and cells having threshold voltages higher than the verify voltage Vx as the first fast cells in the first memory cell group.

Referring to FIG. 4, the memory cell A, which is a slow cell, and the memory cell B, which is a fast cell, may be distinguished on the basis of the verify voltage Vx. In FIG. 5, after a program pulse is applied to the memory cells A and B and the memory cells C and D, the verify voltage Vx may be applied to the memory cell group including the memory cells A and B in order to distinguish slow cells and fast cells from each other.

The verify voltage Vx may be a difference value between the program start voltage of the second memory cell group and the program start voltage of the first memory cell group. In other words, the verify voltage Vx may be a difference value in program start voltage between the memory cells A and B and the memory cells C and D. This is because a program pulse, which is increased by the difference value between the program start voltage of the second memory cell group and the program start voltage of the first memory cell group from the program pulse supposed to be applied to the memory cell A, which is the slow cell, is applied to the memory cells C and D in a subsequent program loop.

When determining the first fast cells and the first slow cells in the first memory cell group, the peripheral circuit 120 may determine whether at least one of the memory cells of the first memory cell group has reached a target level of the corresponding cell and may determine the first fast cells and the first slow cells when at least one of the memory cells in the first memory cell group has reached the target level of the corresponding cell. The verify voltage Vx for differentiating slow cells and fast cells from each other may be applied after at least one of the memory cells in the memory group including the memory cells A and B has reached the target level PV1. Through these processes, a program speed may be increased by applying the verify voltage Vx at any time when the need arises.

Finally, at step S330, the peripheral circuit may apply the third program pulse, which is increased by the step voltage from the first program pulse, to the first fast cells in the first memory cell group in the n+1-th program loop, and may apply the fourth program pulse, which is increased by the step voltage from the second program pulse, to the first slow cells in the first memory cell group and the second memory cell group.

The above-described programming method according to an embodiment of the present invention may use an ISPP method in order to increase a program speed. According to the ISPP, a selected page may be programmed several times by gradually increasing a word line bias voltage at each step (i.e., each program cycle).

Referring to FIG. 5, a program pulse, which is increased by the step voltage from the program pulse applied to the memory cells A and B in the previous program loop, may be applied to the memory cell B, which is the fast cell, in a second program loop. However, a program pulse, which is increased by the step voltage from the program pulse applied to the memory cells C and D in the previous program loop, may be applied to the memory cell A, which is the slow cell, and the memory cells C and D each having a higher target level than the memory cell A. Through this program operation, a program speed with respect to the memory cell A, which is the slow cell, may be increased.

The programming method of the semiconductor memory device according to an embodiment of the present invention will be described below in detail. It may be assumed that in FIGS. 4 and 5, the start voltage of the program pulse, which uses PV1 as the target level, is 15V and the start voltage of the program pulse, which uses PV2 as the target level, is 16.1V. In addition, it may be assumed that the step voltage is 0.3V. Conventionally, the start voltage of 15V of the program pulse may be applied in the first program loop in which the start voltage is applied to the memory cells A and B, which are programmed to reach PV1 as the target level, and a subsequent program pulse of 15.3V may be applied irrespective of a slow cell or a fast cell. In comparison, according to an embodiment of the present invention, the program pulse applied to the memory cells C and D using PV2 as the target level may be applied to the memory cell A, which is the slow cell, in a second program loop. In other words, the start voltage of 16.1V of the program pulse may be applied to the memory cells C and D in the first program loop. Since a subsequent program pulse of 16.4V, which is increased by the step voltage, is applied, the subsequent program pulse of 16.4V may also be applied to the memory cell A.

As a result, 16.4V, instead of 15.3V, which is supposed to be applied in the second program loop, is applied to the memory cell A, so that the program pulse, which is increased by the difference therebetween, i.e., 1.1V, may be applied. The difference of 1.1V is about three times as much as 0.3.V. Therefore, a program speed may be increased since three program pulses each increased by the step voltage may not be applied to the memory cell A which is the slow cell. In addition, the program speed may be further increased since the verify voltage PV1 may not be applied three times after the three program pulses are applied.

Figure 6:
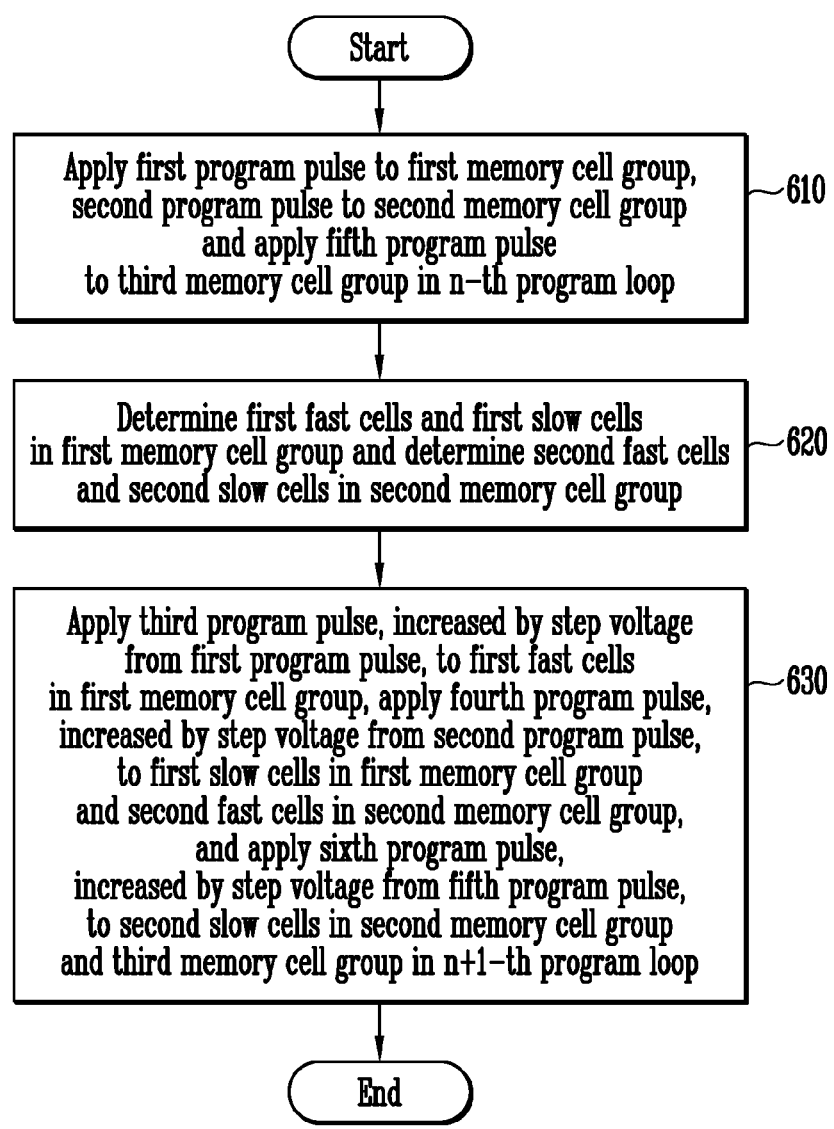
FIG. 6 is a flowchart illustrating a programming method of a semiconductor memory device according to an embodiment of the present invention.

FIG. 6 is a flowchart illustrating a programming method of a semiconductor memory device according to an embodiment of the present invention.

Figure 7:
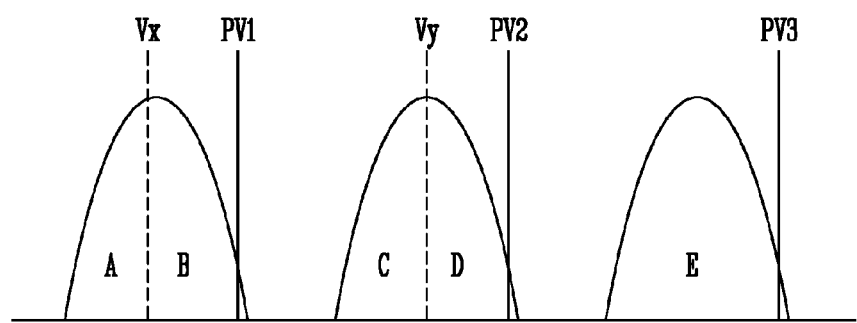
FIG. 7 is a diagram illustrating a threshold voltage distribution of memory cells programmed by a programming method of a semiconductor memory device according to an embodiment of the present invention.
Figure 8:
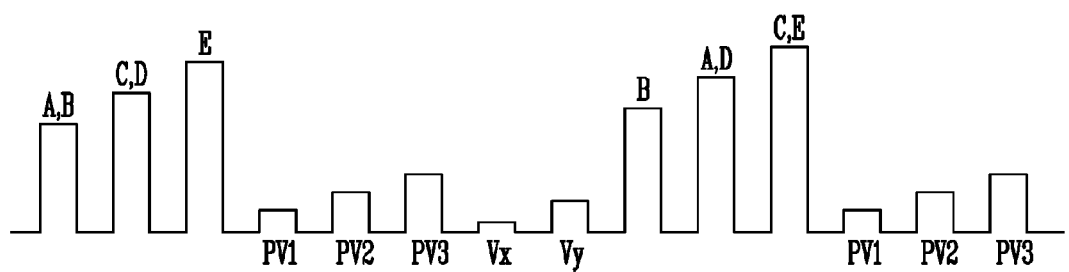
FIG. 8 is a diagram showing how a program voltage and a verify voltage are applied for illustrating a programming method of a semiconductor memory device according to an embodiment of the present invention.

In addition, FIG. 7 is a diagram illustrating a threshold voltage distribution of memory cells programmed by a programming method of a semiconductor memory device according to an embodiment of the present invention. FIG. 8 is a diagram showing how a program voltage and a verify voltage are applied for illustrating a semiconductor memory device according to an embodiment of the present invention.

Hereinafter, a programming method of a semiconductor memory device according to an embodiment of the present invention is described. First, at step S610, the peripheral circuit 120 may apply a first program pulse to a first memory cell group and a second program pulse to a second memory cell group in an n-th program loop. In addition, the peripheral circuit 120 may apply a fifth program pulse to a third memory cell group. These program pulses may be generated by the voltage generator 122. The first memory cell group, the second memory cell group and the third memory cell group may be programmed to different target levels. In addition, the second memory cell group may be programmed to a higher target level than the first memory cell group, and the third memory cell group may be programmed to a higher target level than the second memory cell group.

In FIGS. 7 and 8, the memory cells A and B may correspond to a single memory cell group, the memory cells C and D may correspond to another memory cell group, and the memory cell E may correspond to yet another memory cell group. The memory cells A and B may be included in a cell group programmed to reach PV1 as the target level, the memory cells C and D may be included in a cell group programmed to reach PV2 as the target level, and the memory cell E may be included in a cell group programmed to reach PV3 as the target level. Referring to FIG. 8, program pulses having different levels may be applied to the memory cells A and B, the memory cells C and D and the memory cell E in the previous program loop.

Such characteristics may indicate that the above-described programming method of a semiconductor memory device according to an embodiment of the present invention may be applied to both multi-level cells (MLC) and trip level cells (TLC). However, the present invention is not limited thereto, and this programming method may also be applied to cells having other various levels.

Subsequently, at step S620, the peripheral circuit 120 may determine first fast cells and first slow cells in the first memory cell group and determine second fast cells and second slow cells in the second memory cell group. The peripheral circuit 120 may apply the verify voltage Vx to the first memory cell group and determine cells having threshold voltages less than the verify voltage Vx as the first slow cells and cells having threshold voltages higher than the verify voltage Vx as the first fast cells. In addition, the peripheral circuit 120 may apply the verify voltage Vy to the second memory cell group and determine cells having threshold voltages less than the verify voltage Vy as the second slow cells and cells having threshold voltages higher than the verify voltage Vy as the second fast cells.

Referring to FIG. 7, the memory cell A, which is the slow cell, and the memory cell B, which is the fast cell, may be differentiated on the basis of the verify voltage Vx, and the memory cell C, which is the slow cell, and the memory cell D, which is the fast cell, may be differentiated on the basis of the verify voltage Vy. In FIG. 8, after the program pulse is applied to the memory cells A and B, the memory cells C and D and the memory cell E, the verify voltage Vy may be applied to memory cell group including the memory cells A and B and the memory cell group including the memory cells C and D in order to differentiate slow cells and fast cells from each other.

The verify voltage Vx may be a difference value between a program start voltage of the second memory cell group and a program start voltage of the first memory cell group. In other words, the verify voltage Vx may be the difference value in program start voltage between the memory cells A and B and the memory cells C and D. This is because a program pulse, which is increased by the difference value between the program start voltage of the second memory cell group and the program start voltage of the first memory cell group from the program pulse supposed to be applied to the memory cell A, which is the slow cell, is applied to the memory cells C and D in a subsequent program loop. In substantially the same manner, the verify voltage Vy may be the difference value between the program start voltage of the third memory cell group and the program start voltage of the second memory cell group. In other words, the verify voltage Vy may be the difference value in program start voltage between the memory cells C and D and the memory cell E.

When determining the first fast cells and the first slow cells in the first memory cell group, the peripheral circuit 120 may determine whether at least one of the memory cells of the first memory cell group has reached a target level of the corresponding memory cell, and may determine the first fast cells and the first slow cells when at least one of the memory cells of the first memory cell group has reached the target level of the corresponding memory cell. The verify voltage Vx used to determine slow cells and fast cells may be applied after at least one of the memory cells in the memory cell group including the memory cells A and B has reached the target level PV1. Through these processes, a program speed may be increased by applying the verify voltage Vx at any time the need arises.

In substantially the same manner, when determining second fast cells and second slow cells in the second memory cell group, the peripheral circuit 120 may determine whether at least one of the memory cells in the first memory cell group has reached a target level of the corresponding cell, and may determine the second fast cells and the second slow cells when at least one of the memory cells in the second memory cell group has reached the target level. In other words, the verify voltage Vy for differentiating a slow cell and a fast cell may be applied after at least one of the memory cells included in the memory cell group including the memory cells C and D has reached the target level PV2.

Finally, at step S630, in an n+1-th program loop, the peripheral circuit 120 may apply a third program pulse, which is increased by the step voltage from the first program pulse, to the first fast cells in the first memory cell group, apply a fourth program pulse, which is increased by the step voltage from the second program pulse, to the first slow cells in the first memory cell group and the second memory cell group, apply a sixth program pulse, which is increased by the step voltage from the fifth program pulse, to the second slow cells in the second memory cell group and the third memory cell group. The fourth program pulse may be applied only to the first slow cells in the first memory cell group and the second fast cells in the second memory cell group.

The above-described programming method according to an embodiment the present invention may use an ISPP method in order to increase a program speed. According to the ISPP method, a selected page may be programmed several times by gradually increasing a word line bias voltage at each step (i.e., each program cycle).

Referring to FIG. 8, a program pulse, which is increased by the step voltage from the program pulse applied to the memory cells A and B in the previous program loop, may be applied to the memory cell B, which is the fast cell, in the second program loop. However, a program pulse, which is increased by the step voltage from the program pulse applied to the memory cells C and D in the previous program loop, may be applied to the memory cell A, which is the slow cell, and the memory cell D which is the fast cell. In addition, a program pulse, which is increased by the step voltage from the program pulse applied to the memory cell E in the previous program loop, which is the slow cell, may be applied to the memory cell C and the memory cell E. Through this program operation, a program speed with respect to the memory cell A and the memory cell C, which are the slow cells, may be increased.

The above-described programming method of a semiconductor memory device according to an embodiment of the present invention is described in detail. It is assumed that in FIGS. 7 and 8, the start voltage of the program pulse using PV1 as the target level is 15V, the start voltage of the program pulse using PV2 as the target level is 16.1V, and the start voltage of the program pulse using PV3 as the target level is 17.2V. In addition, it may be assumed that the step voltage is 0.3V. The start voltage of 15V of the program pulse may be applied in the first program loop in which the start voltage is applied to the memory cells A and B programmed to reach PV1 as the target level. A start voltage of 15.3V of a subsequent program pulse may be applied irrespective of a slow cell or a fast cell. In addition, the start voltage of 16.1V of the program pulse may be applied in the first program loop in which the start voltage is applied to the memory cells C and D using PV2 as the target level. A start voltage of 16.4V of a subsequent program pulse may be applied irrespective of a slow cell or a fast cell.

In comparison, according to an embodiment of the present invention, the program pulse applied to the memory cells C and D using PV2 as the target level may be applied to the memory cell A, which is the slow cell, in the second program loop. In other words, the start voltage of 16.1V of the program pulse may be applied to the memory cells C and D in the first program loop, and the subsequent program pulse of 16.4V, which is increased by the step voltage, may be applied. Therefore, the subsequent program pulse of 16.4V may also be applied to the memory cell A. In addition, the program pulse applied to the memory cell E using PV3 as the target level may be applied to the memory cell C, which is the slow cell, in the second program loop. In other words, the start voltage of 17.2V of the program pulse may be applied to the pulse memory cell E in the first program loop. A subsequent program pulse of 17.5V, which is increased by the step voltage, may be applied, and the subsequent program pulse of 17.5V may also be applied to the memory cell C.

As a result, since 16.4V, instead of 15.3V which is supposed to be applied in the second program loop, may be applied to the memory cell A, a program pulse increased by a difference therebetween, i.e., 1.1V may be applied thereto. In addition, since 17.5V, instead of 16.4V which is supposed to be applied in the second program loop, is applied to the memory cell C, the program pulse increased by the difference of 1.1V therebetween may be applied thereto.

The difference of 1.1V may be approximately three times as much as 0.3V. Therefore, a program speed may be increased since three program pulses each increased by the step voltage are not applied to the memory cells A and C. In addition, the program speed may be further increased since each of the verify voltages PV1 and PV2 is not applied three times after the three program pulses are applied.

Figure 9:
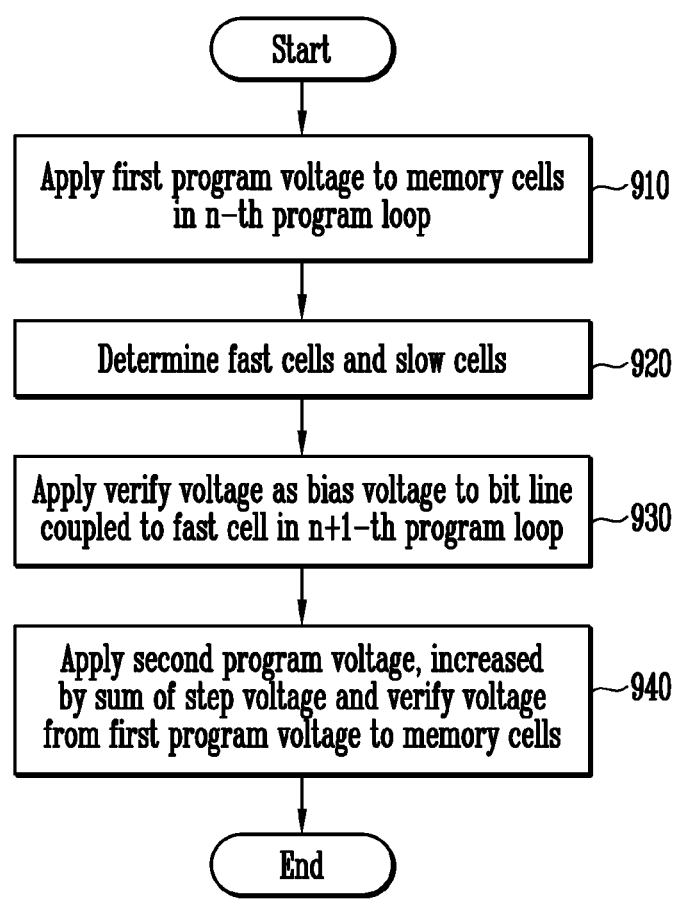
FIG. 9 is a flowchart illustrating a programming method of a semiconductor memory device according to an embodiment of the present invention.

FIG. 9 is a flowchart illustrating a programming method of a semiconductor memory device according to an embodiment of the present invention.

Figure 10:
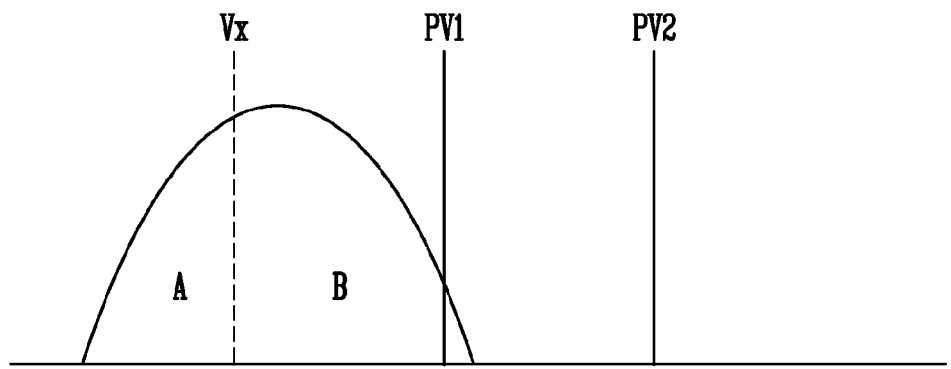
FIG. 10 is a diagram illustrating a threshold voltage distribution of memory cells programmed by a programming method of a semiconductor memory device according to an embodiment of the present invention.
Figure 11:
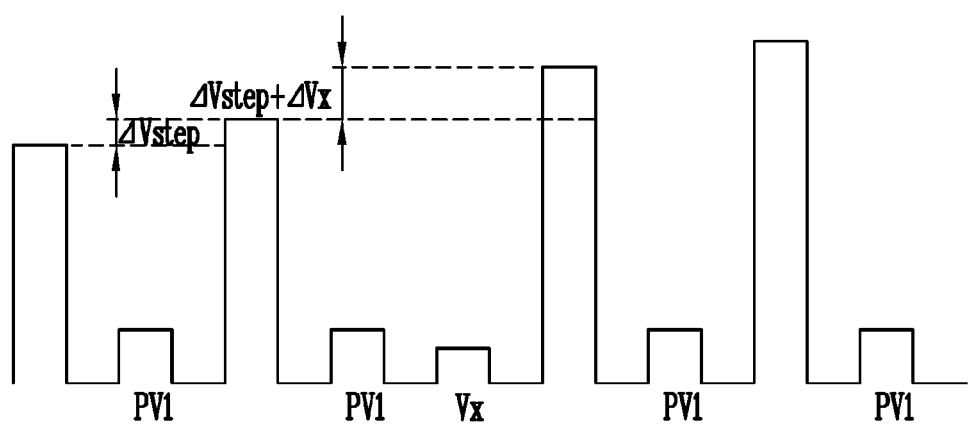
FIG. 11 is a diagram showing how a program voltage and a verify voltage are applied for illustrating a programming method of a semiconductor memory device according to an embodiment of the present invention.

FIG. 10 is a view illustrating a threshold voltage distribution of memory cells programmed by a programming method of a semiconductor memory device according to an embodiment of the present invention. FIG. 11 is a view showing how a program voltage and a verify voltage are applied for illustrating a programming method of a semiconductor memory device according to an embodiment of the present invention.

A programming method of a semiconductor memory device according to an embodiment of the present invention, at step S910, the peripheral circuit 120 may apply a first program pulse to a plurality of word lines coupled to the memory cells in the n-th program loop. The first program pulse may be generated by the voltage generator 122.

Subsequently, at step S920, the peripheral circuit 120 may determine fast cells and slow cells, among the memory cells. The peripheral circuit 120 may apply the verify voltage Vx to the memory cell and determine cells having threshold voltages less than the verify voltage Vx as the slow cells and cells having threshold voltages higher than the verify voltage Vx as the fast cells. With reference to FIG. 10, the memory cell A, which is the slow cell, and the memory cell B, which is the fast cell, may be differentiated on the basis of the verify voltage Vx. Referring to FIG. 11, after the program pulse is applied to the memory cell, the verify voltage Vx may be applied in order to differentiate slow cells and fast cells, among the memory cells.

The verify voltage Vx may be a difference value between the n (i.e., n being a positive integer) target level that some of the memory cells reach and the n+1 target level that the rest of the memory cells or some of the memory cells reach. In other words, a difference between PV2 and PV1 may be the verify voltage Vx.

In addition, when determining fast cells and slow cells among the memory cells, the peripheral circuit 120 may determine whether at least one of the memory cells has reached a target level of the corresponding memory cell and may determine the fast cells and the slow cells when at least one of the memory cells has reached the target level of the corresponding memory cell. The peripheral circuit 120 may apply the verify voltage Vx for determining a slow cell and a fast cell after at least one of the memory cells has reached the target level PV1. Through these processes, the verify voltage Vx may be applied at any time when the need arises.

Thereafter, the peripheral circuit 120 may apply the verify voltage Vx as a bias voltage to a bit line coupled to the fast cells in the n+1-th program loop at step S930 and apply a second program pulse, which is increased by a sum of the step voltage and the verify voltage Vx from the first program pulse, to the memory cells at step S940.

The programming method according to the above embodiments of the present invention may use an ISPP method in order to increase a program speed. According to the ISPP method, a selected page may be programmed several times by gradually increasing a word line bias voltage at each step (i.e., each program cycle).

Referring to FIG. 11, a program pulse, which is increased by the sum of the step voltage and the verify voltage Vx from the previous program pulse, may be applied to all memory cells in a third program loop. Since a voltage higher than the program pulse supposed to be applied is increased, a program speed may be increased. At this time, the verify voltage Vx may be applied as a bias voltage to a bit line coupled to the fast cell in order to match the program speeds of the fast cell and the slow cell. When a program is performed by applying the verify voltage Vx to the bit line, a voltage difference between a word line and a channel may be reduced. Thus, the program speed of the fast cell may be reduced so that the program speeds of the fast cell and the slow cell may be matched with each other.

A programming method of the semiconductor memory device according to an embodiment of the present invention is described below in detail. In FIGS. 10 and 11, it may be assumed that a difference in level between PV1 and PV2 is 1.1V and the step voltage is 0.3V. Conventionally, as a program loop increases, a program pulse, which is increased by the step voltage, may be applied to all memory cells. In comparison, according to an embodiment of the present invention, a program pulse, which is increased by the sum of the step voltage and verify voltage Vx from the previous program pulse, may be applied to all memory cells. In other words, since a voltage, which is increased by 1.4V (i.e., deltaVstep+deltaVx), which is the sum of the step voltage of 0.3V (i.e., deltaVstep) and the verify voltage of 1.1V (i.e., deltaVx), from the program pulse supposed to be applied is applied, the program speed may be increased. At this time, since 1.1V, which is equal to the verify voltage Vx, may be applied to the bit line coupled to the fast cells, the program speed of the fast cell and the program speed of the slow cell may be matched with each other.

As a result, since the voltage, which is increased by 1.4 from the program pulse, is applied to the memory cell A, which is the slow cell, among the memory cells, 1.4V is approximately three times as much as the step voltage of 0.3V. Thus, the program speed may be increased without applying the program pulse three times, each time the program pulse is increased by the step voltage, to the memory cell A which is the slow cell. In addition, since the verify voltage PV1 is not applied three times after the program pulse is applied three times, the program speed may be further increased. Since the voltage of 1.1V is applied to the bit line coupled to the fast cell, the program speed of the fast cell may be matched with that of the slow cells.

Figure 12:
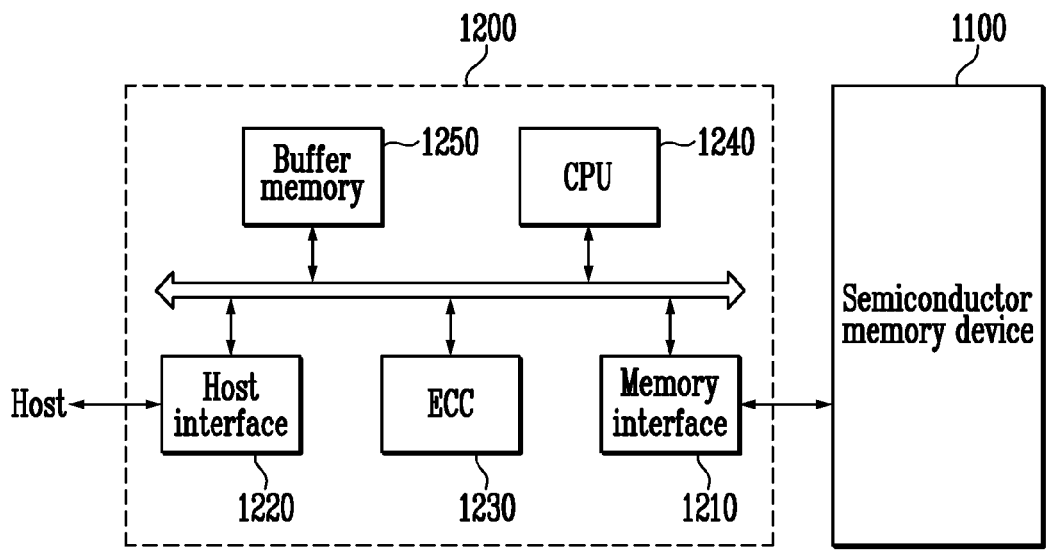
FIG. 12 is a block diagram illustrating a memory system including a semiconductor memory device.

FIG. 12 is a block diagram illustrating a memory system 1000 including a semiconductor memory device 1100.

As illustrated in FIG. 12, the memory system 1000 may include a semiconductor memory device 1100 and a controller 1200.

The semiconductor memory device 1100 may be configured and operated in substantially the same manner as the semiconductor memory device 100 described above with reference to FIG. 1 as well as FIGS. 2-11 as discussed above. Thus, a detailed description thereof will be omitted.

The controller 1200 may be coupled to a host and the semiconductor memory device 1100 and be configured to access the memory device 1200 in response to a request from the host. For example, the controller 1200 may be configured to control read, write, erase and background operations of the semiconductor memory device 1100. The controller 1200 may be configured to provide an interface between the semiconductor memory device 1100 and the host. The controller 1200 may be configured to drive a firmware for controlling the semiconductor memory device 1100.

The controller 1200 may include a memory interface 1210, a host interface 1220, an error check and correct (ECC) circuit 1230, a central processing unit 1240 and a buffer memory 1250.

The memory interface 1210 may transfer data, transferred from the buffer memory 1250, to the semiconductor memory device 1100. The memory interface 1210 may transfer the data, read from the semiconductor memory device 1100, to the buffer memory 1250. The memory interface 1210 may use an interface of a NAND flash memory. In other words, the controller 1200 may perform program read and erase operations by using the NAND flash memory interface.

The host interface 1220 may include a protocol for performing a data exchange between the host and the controller 1200. In an embodiment, the host interface 1220 may be configured to communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1230 may generate a parity bit by using data transferred to the semiconductor memory device 1100. The generated parity bit may be stored in semiconductor memory chips of the semiconductor memory device 1100. The ECC circuit 1230 may detect errors in the data read from the semiconductor memory device 1100. When the detected error is a correction range, the ECC circuit 1230 may correct the detected error.

The central processing unit 1240 may analyze and process a signal input from the host. The central processing unit 1240 may control the host or the semiconductor memory device 1100 through the host interface 1220 or the memory interface 1210.

The central processing unit 1240 may control the semiconductor memory device 1100 according to firmware for controlling the semiconductor memory device 1100.

The buffer memory 1250 may temporarily store program data provided from the host or the data read from the semiconductor memory device 1100. In addition, the buffer memory 1250 may store meta data or cache data to be stored in the semiconductor memory device 1100. In the event of sudden power off, the meta data or the cache data stored in the buffer memory 1250 may be stored in the semiconductor memory device 1100. The buffer memory 1250 may include DRAM, SRAM and the like.

The controller 1200 and the semiconductor memory device 1100 may be integrated into one semiconductor device. In an embodiment, the controller 1200 and the semiconductor memory device 1100 may be integrated into one semiconductor device to configure a memory card. For example, the controller 1200 and the semiconductor memory device 1100 may be integrated into one semiconductor device to form a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1200 and the semiconductor memory device 1100 may be integrated into a single semiconductor device. In an embodiment, the controller 1200 and the semiconductor memory device 1100 may be integrated into a single semiconductor device to form a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 1200 may be integrated into one semiconductor device to form a Solid State Drive (SSD). The SSD may include a storage device configured to store data in a semiconductor memory. In a case where the memory system 1000 is used as the SSD, a speed of the operation of the host connected to the memory system 1000 may be remarkably improved.

In an example, the memory system 1000 may be used as one of various components of an electronic device, such as a computer, an ultra mobile PC (UMPC), a workstation, a netbook, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device and/or one of various devices for computing systems, etc.

In an embodiment, the semiconductor memory device 1100 or the memory system 1000 may be packaged in a variety of ways. For example, in various embodiments, the semiconductor memory device 100 or the memory system 1000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP) and/or a wafer-level processed stack package (WSP), etc.

Figure 13:
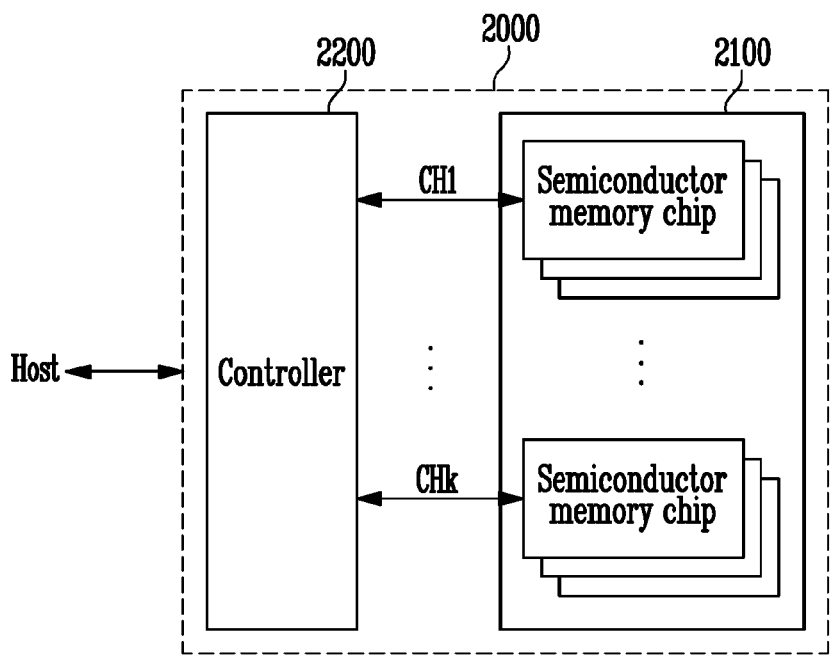
FIG. 13 is a block diagram illustrating an application example of the memory system shown in FIG. 12.

FIG. 13 is a block diagram illustrating an application example 2000 of the memory system 1000 shown in FIG. 12.

Referring to FIG. 13, the memory system 2000 may include the semiconductor memory device 2100 and the controller 2200. The semiconductor memory device 2100 may include a plurality of semiconductor memory chips. The semiconductor memory chips may be divided into a plurality of groups.

The plurality of semiconductor memory chips may be divided into a plurality of groups. As illustrated in FIG. 12, the plurality of groups may communicate with the controller 2200 through first to k-th channels CH1 to CHk.

Each of the groups may communicate with the controller 2200 through a single common channel. The controller 2200 may be configured in substantially the same manner as the controller 1200 as described above with reference to FIG. 12 and may control the plurality of memory chips of the semiconductor memory device 2100.

FIG. 13 illustrates the plurality of semiconductor memory chips coupled to a single channel. However, the memory system 2000 may be modified so that a single semiconductor memory chip may be coupled to a single channel.

Figure 14:
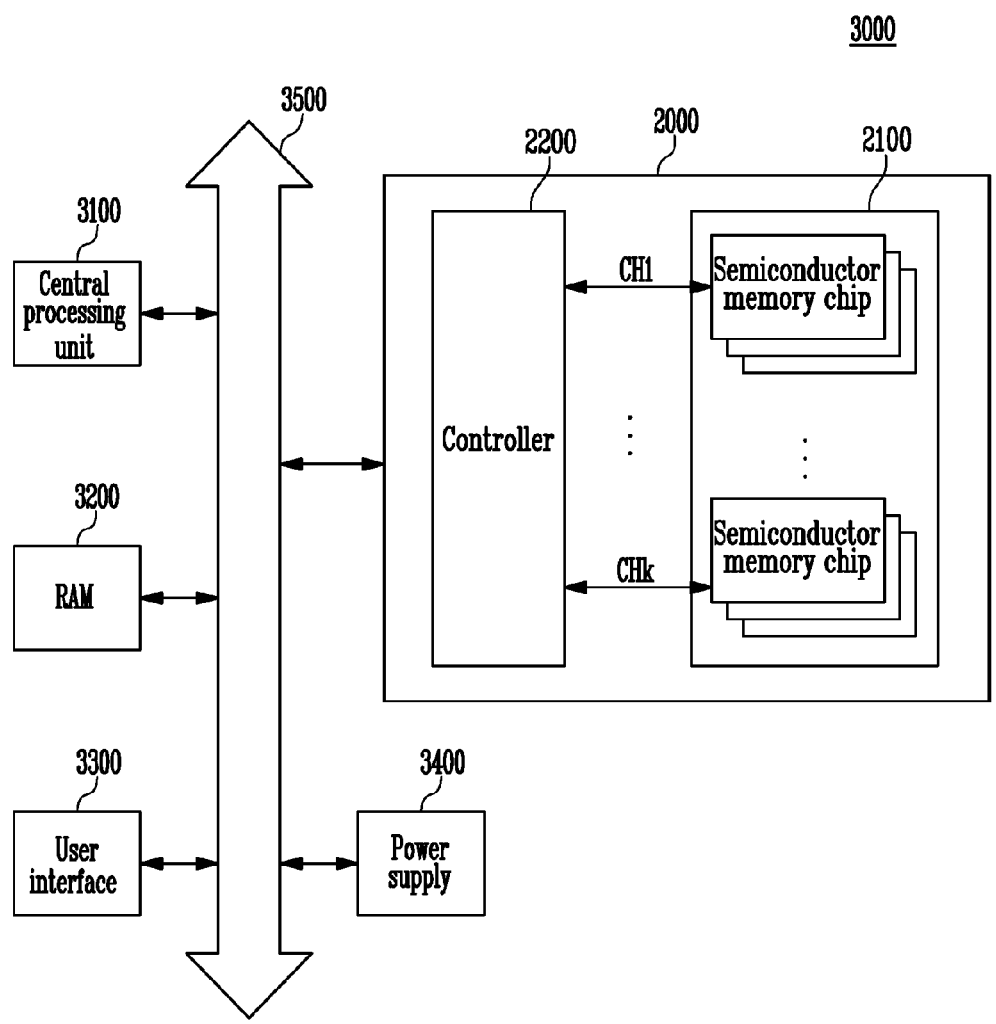
FIG. 14 is a block diagram illustrating a computing system including the memory system described with reference to FIG. 13.

FIG. 14 is a block diagram illustrating a computing system 3000 including the memory system 2000 described above with reference to FIG. 13.

Referring to FIG. 13, the computing system 3000 may include a central processing unit 3100, a random access memory (RAM) 3200, a user interface 3300, a power supply 3400, a system bus 3500 and the memory system 2000.

The memory system 2000 may be electrically coupled to the central processing unit 3100, the RAM 3200, the user interface 3300 and the power supply 3400 through the system bus 3500. Data provided through the user interface 3300 or processed by the central processing unit 3100 may be stored in the memory system 2000.

FIG. 14 illustrates the semiconductor memory device 2100 coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 14 illustrates the memory system 2000 described above with reference to FIG. 13. However, the memory system 2000 may be replaced by the memory system 1000 described above with reference to FIG. 15. In an embodiment, the computing system 3000 may include both memory systems 1000 and 2000 described above with reference to FIGS. 12 and 13, respectively.

A semiconductor memory device may include a memory cell array and a peripheral circuit as discussed above with regards to FIGS. 1-14. The memory cell array may include a plurality of memory cells arranged at intersections between a plurality of word lines and a plurality of bit lines. During a program operation, the peripheral circuit may apply a first program pulse to the plurality of word lines coupled to the memory cells and determine fast cells and slow cells, among the memory cells in an n-th program loop. The peripheral circuit may apply a verify voltage as a bias voltage to a bit line coupled to the fast cells and apply a second program pulse, which is increased by a sum of the step voltage and the verify voltage from the first program pulse, to the memory cells in an n+1-th program loop.

When determining fast cells and slow cells, the peripheral circuit may apply the verify voltage, among the memory cells, and determine cells having threshold voltages less than the verify voltage as the slow cells and cells having threshold voltages higher than the verify voltage as the fast cells.

The verify voltage may be a difference value between an n target level that some of the memory cells reach and an n+1 target level that the rest of the memory cells or some of the memory cells reach.

When determining fast cells and slow cells, among the memory cells, the peripheral circuit may determine whether at least one of the memory cells has reached a target level of the corresponding cell and may determine the fast cells and the slow cells when at least one of the memory cells has reached the target level of the corresponding cell.

According to the present invention, a threshold voltage distribution is narrowed, and programming time may be reduced.

What is claimed is:

1. A programming method of a semiconductor memory device, the programming method comprising:
   in at least one program loop,
   applying a first program pulse to a first memory cell group;
   applying a second program pulse to a second memory cell group; and
   determining first fast cells and first slow cells in the first memory cell group, and in a program loop after the at least one program loop,
applying a third program pulse, which is increased by a step voltage from the first program pulse, to the first fast cells in the first memory cell group; and
applying a fourth program pulse, which is increased by the step voltage from the second program pulse, to the first slow cells in the first memory cell group and the second memory cell group,
wherein the first memory cell group and the second memory cell group are programmed to different target voltage levels.

2. The programming method of claim 1, wherein the second memory cell group is programmed to a higher target voltage level than the first memory cell group.

3. The programming method of claim 2, wherein the second memory cell group includes cells programmed to different target voltage levels.

4. The programming method of claim 1, wherein the determining of the first fast cells and the first slow cells in the first memory cell group comprises:
applying a verify voltage; and
determining cells having threshold voltages less than the verify voltage as the first slow cells and determining cells having threshold voltages higher than the verify voltage as the first fast cells.

5. The programming method of claim 4, wherein the verify voltage is a difference value between a program start voltage of the second memory cell group and a program start voltage of the first memory cell group.

6. The programming method of claim 1, wherein the determining of the first fast cells and the first slow cells in the first memory cell group comprises:
determining whether at least one of cells in the first memory cell group has reached a target voltage level of the at least one cell; and
determining the first fast cells and the first slow cells when the at least one cell in the first memory cell group has reached the target voltage level of the at least one cell.

7. The programming method of claim 1, wherein the at least one program loop further comprises:
applying a fifth program pulse to a third memory cell group; and
determining second fast cells and second slow cells in the second memory cell group, and
the program loop after the at least one program loop further comprises:
applying a sixth program pulse, which is increased by the step voltage from the fifth program pulse, to the second slow cells in the second memory cell group and the third memory cell group,
wherein the fourth program pulse is applied to the first slow cells in the first memory cell group and the second fast cells in the second memory cell group.

8. A semiconductor memory device, comprising:
a memory cell array including a plurality of memory cells coupled to a plurality of word lines; and
a peripheral circuit suitable for, during a program operation, applying a first program pulse to first word lines coupled to a first memory cell group, applying a second program pulse to second word lines coupled to a second memory cell group and determining first fast cells and first slow cells in the first memory cell group in at least one program loop, the peripheral circuit suitable for applying a third program pulse, which is increased by a step voltage from the first program pulse, to word lines coupled to the first fast cells, among the first word lines, and applying a fourth program pulse, which is increased by the step voltage from the second program pulse, to word lines coupled to the first slow cells, among the first word lines, and the second word lines in a program loop after the at least one program loop,
wherein the first memory cell group and the second memory cell group are programmed to different target voltage levels.

9. The semiconductor memory device of claim 8, wherein the second memory cell group is programmed to a higher target voltage level than the first memory cell group.

10. The semiconductor memory device of claim 9, wherein the second memory cell group includes cells programmed to different target voltage levels.

11. The semiconductor memory device of claim 8, wherein when determining the first fast cells and the first slow cells in the first memory cell group, the peripheral circuit applies a verify voltage to the first word lines and determines cells having threshold voltages less than the verify voltage as the first slow cells and cells having threshold voltages higher than the verify voltage as the first fast cells.

12. The semiconductor memory device of claim 11, wherein the verify voltage is a difference value between a program start voltage of the second memory cell group and a program start voltage of the first memory cell group.

13. The semiconductor memory device of claim 8, wherein when determining the first fast cells and the first slow cells in the first memory cell group, the peripheral circuit determines whether at least one of cells in first memory cell group has reached a target voltage level of the at least one cell and determines the first fast cells and the first slow cells when the at least one of the cells in the first memory cell group has reached the target voltage level of the at least one cell.

14. The semiconductor memory device of claim 8, wherein the peripheral circuit applies a fifth program pulse to third word lines coupled to a third memory cell group and determines second fast cells and second slow cells in the second memory cell group in the at least one program loop, and
the peripheral circuit applies a sixth program pulse, which is increased by the step voltage from the fifth program pulse, to word lines, coupled to the second slow cells, among the second word lines, and the third word lines and applies the fourth program pulse to the word lines, coupled to the first slow cells, among the first word lines, and word lines, coupled to the second fast cells, among the second word lines in the program loop after the at least one program loop.

15. A programming method of a semiconductor memory device, the programming method comprising:
in at least one program loop,
applying a first program pulse to memory cells; and
determining fast cells and slow cells, among the memory cells, and
in a program loop after the at least one program loop,
applying a verify voltage as a bias voltage to a bit line coupled to the fast cells; and
applying a second program pulse, which is increased by a sum of the step voltage and the verify voltage from the first program pulse, to the memory cells,
wherein the first memory cell group and the second memory cell group are programmed to different target voltage levels.

16. The programming method of claim 15, wherein the determining of the fast cells and the slow cells, among the memory cells, comprises:
applying the verify voltage; and determining cells having threshold voltages less than the verify voltage as the slow cells and cells having threshold voltages higher than the verify voltage as the fast cells.

17. The programming method of claim 16, wherein the verify voltage is a difference value between an n target voltage level that some of the memory cells reach and an n+1 target voltage level that a rest of the memory cells or some of the memory cells reach, n being a positive integer greater than zero.

18. The programming method of claim 15, wherein the determining of the fast cells and the slow cells, among the memory cells, comprises:
- determining whether at least one of the memory cells has reached a target voltage level of the at least one memory cell; and
- determining the fast cells and the slow cells when at least one of the memory cells has reached the target voltage level of the at least one memory cell.

* * * * *